United States Patent
Gauthier, Jr. et al.

(10) Patent No.: US 10,741,685 B2
(45) Date of Patent: Aug. 11, 2020

(54) SEMICONDUCTOR DEVICES HAVING A FIN CHANNEL ARRANGED BETWEEN SOURCE AND DRIFT REGIONS AND METHODS OF MANUFACTURING THE SAME

(71) Applicant: GLOBALFOUNDRIES Inc., Grand Cayman (KY)

(72) Inventors: Robert Gauthier, Jr., Williston, VT (US); Souvick Mitra, Essex Junction, VT (US); Alain Loiseau, Williston, VT (US); Tsai Tsung-Che, Essex Junction, VT (US); Mickey Yu, Essex Junction, VT (US); You Li, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/137,739

(22) Filed: Sep. 21, 2018

(65) Prior Publication Data

US 2020/0098909 A1 Mar. 26, 2020

(51) Int. Cl.
*H01L 29/78* (2006.01)
*H01L 29/66* (2006.01)
(Continued)

(52) U.S. Cl.
CPC .. *H01L 29/7809* (2013.01); *H01L 21/823468* (2013.01); *H01L 27/2454* (2013.01);
(Continued)

(58) Field of Classification Search
CPC ..... H01L 21/823431; H01L 21/823821; H01L 21/845; H01L 27/0886; H01L 27/0924; H01L 27/1211; H01L 29/66795–66818; H01L 29/785–7856; H01L 2029/7857–7858; H01L 2924/13067; H01L 29/66681–66704; H01L 29/7816–7826; H01L 29/66712–66734; H01L 29/7802–7815; H01L 29/7835; H01L 29/66659; H01L 29/1095;
(Continued)

(56) References Cited

U.S. PATENT DOCUMENTS 9,041,127 B2 5/2015 Campi, Jr. et al.
9,209,248 B2 * 12/2015 Tegen ................ H01L 29/0696
(Continued)

*Primary Examiner* — Younes Boulghassoul
(74) *Attorney, Agent, or Firm* — Thompson Hine LLP; Francois Pagette

(57) ABSTRACT

Structures for laterally-diffused metal-oxide-semiconductor devices and drain-extended metal-oxide-semiconductor devices, as well as methods of forming laterally-diffused metal-oxide-semiconductor devices and drain-extended metal-oxide-semiconductor devices. A gate electrode is arranged to extend about a semiconductor fin projecting from a substrate. A drain region is arranged in the substrate, and a source region is coupled with the semiconductor fin. The source region is arranged over the semiconductor fin. A drift region is arranged in the substrate between the drain region and the semiconductor fin. The drain region, source region, and drift region have a given conductivity type. The drift region has a lower electrical conductivity than the drain region.

14 Claims, 4 Drawing Sheets

(51) Int. Cl.
*H01L 29/10* (2006.01)
*H01L 29/06* (2006.01)
*H01L 21/8234* (2006.01)
*H01L 27/24* (2006.01)

(52) U.S. Cl.
CPC ...... *H01L 29/0653* (2013.01); *H01L 29/1095* (2013.01); *H01L 29/66681* (2013.01); *H01L 29/66712* (2013.01); *H01L 29/7817* (2013.01)

(58) Field of Classification Search
CPC ......... H01L 27/2454; H01L 21/823487; H01L 21/823885; H01L 29/7827–7828; H01L 29/66666; H01L 29/0676; H01L 29/78642; H01L 21/02603; H01L 29/775; H01L 29/66469; H01L 29/66439; H01L 29/66462; H01L 29/78681; H01L 29/42392; H01L 29/66674–66734
See application file for complete search history.

(56) References Cited

U.S. PATENT DOCUMENTS

| | | | |
|---|---|---|---|
| 9,281,379 B1* | 3/2016 | Campi, Jr. | B29C 48/21 |
| 9,379,236 B2 | 6/2016 | Ponoth et al. | |
| 9,698,148 B2 | 7/2017 | Ponoth et al. | |
| 9,768,293 B1* | 9/2017 | Syue | H01L 29/7825 |
| 2008/0038890 A1 | 2/2008 | Tucker | |
| 2013/0062692 A1* | 3/2013 | Chen | H01L 29/4236 257/335 |
| 2015/0035053 A1 | 2/2015 | Singh | |
| 2016/0225896 A1* | 8/2016 | Yoo | H01L 29/0619 |
| 2017/0229570 A1* | 8/2017 | Cheng | H01L 29/785 |
| 2017/0301666 A1* | 10/2017 | Anderson | H01L 27/0617 |
| 2017/0345660 A1* | 11/2017 | Li | H01L 27/0255 |
| 2017/0365603 A1* | 12/2017 | Zhou | H01L 29/4966 |
| 2018/0012967 A1* | 1/2018 | Kang | H01L 29/0653 |
| 2018/0061981 A1* | 3/2018 | Zhou | H01L 21/845 |
| 2019/0131402 A1* | 5/2019 | Liu | H01L 29/1045 |
| 2019/0131406 A1* | 5/2019 | Ciavatti | H01L 29/0653 |

* cited by examiner

SEMICONDUCTOR DEVICES HAVING A FIN CHANNEL ARRANGED BETWEEN SOURCE AND DRIFT REGIONS AND METHODS OF MANUFACTURING THE SAME

BACKGROUND

The present invention relates to semiconductor device fabrication and integrated circuits and, more specifically, to structures for laterally-diffused metal-oxide-semiconductor devices and drain-extended metal-oxide-semiconductor devices, as well as methods of forming laterally-diffused metal-oxide-semiconductor devices and drain-extended metal-oxide-semiconductor devices.

Device structures for a field-effect transistor generally include a source, a drain, and a gate electrode configured to switch carrier flow in a channel region arranged between the source and drain. When a control voltage exceeding a designated threshold voltage is applied to the gate electrode, carrier flow occurs in the channel region to produce a device output current. A fin-type field-effect transistor provides a device structure that that has better electrostatic control of the channel region for improved Ion/Ioff compared to planar field-effect transistors.

Planar field-effect transistors and fin-type field-effect transistors constitute a general category of field-effect transistor structures in which the direction of gated current in the channel region is in a horizontal direction parallel to the substrate surface. A vertical-transport field-effect transistor is a different type of field-effect transistor in which the source and the drain are respectively arranged at the top and bottom of a semiconductor fin. The channel region of a vertical-transport field-effect transistor is arranged in the semiconductor fin between the source and the drain. The direction of gated current in the channel region of a vertical-transport field-effect transistor is in a vertical direction relative to the substrate surface and, therefore, in a direction that is parallel to the height of the semiconductor fin.

High-voltage integrated circuits used, for example, in microwave/RF power amplifiers typically require specialized circuit technology capable of withstanding higher voltages. Laterally-diffused metal-oxide-semiconductor (LDMOS) devices and drain-extended metal-oxide-semiconductor (DEMOS) devices are designed to handle higher voltages than, for example, logic field-effect transistors and may include features such as an extended drain. LDMOS and DEMOS devices are commonly implemented in planar device technologies.

Improved structures for LDMOS and DEMOS devices and methods of forming LDMOS and DEMOS devices are needed.

SUMMARY

In an embodiment, a structure includes a semiconductor fin projecting from a substrate, a gate electrode arranged to extend about the semiconductor fin, a drain region in the substrate, and a source region coupled with the semiconductor fin. The source region is arranged over the semiconductor fin. The structure further includes a drift region arranged in the substrate between the drain region and the semiconductor fin. The drain region, source region, and drift region have a given conductivity type. The drift region has a lower electrical conductivity than the drain region.

In an embodiment, a method includes forming a semiconductor fin that projects from a substrate, forming a drift region in the substrate, forming a drain region in the substrate, forming a gate electrode arranged to extend about the semiconductor fin, and epitaxially growing a source region coupled with the semiconductor fin and arranged over the semiconductor fin de. The drain region, the source region, and the drift region have a given conductivity type. The drift region is arranged in the substrate between the drain region and the semiconductor fin, and the drift region has a lower electrical conductivity than the drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
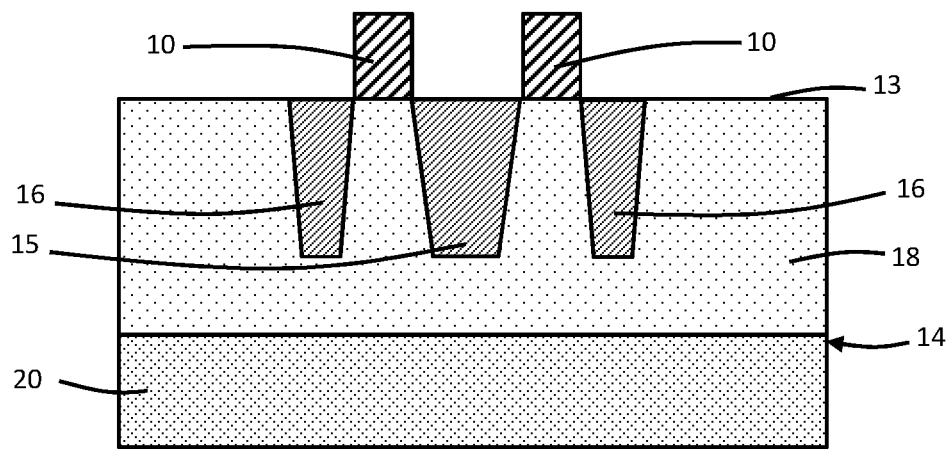
FIGS. 1-3 are cross-sectional views of a device structure at successive fabrication stages of a processing method in accordance with embodiments of the invention.

With reference to FIG. 1 and in accordance with embodiments of the invention, semiconductor fins 10 extend or project in a vertical direction from a substrate 14, such as a bulk single-crystal silicon substrate. The fins 10 are three-dimensional bodies composed of a semiconductor material, such as silicon, and may have a parallel arrangement. The fins 10 may be formed by patterning the substrate 14 or an epitaxial layer grown on the substrate 14.

Shallow trench isolation regions 15, 16 may be formed by defining shallow trenches in the substrate 14 with lithography and etching processes, depositing a dielectric material to fill the shallow trenches, and planarizing and/or recessing the dielectric material. The dielectric material comprising the shallow trench isolation regions 15, 16 may be an oxide of silicon (e.g., silicon dioxide) and/or another electrical insulator deposited by chemical vapor deposition (CVD). The etching process used to form the trenches for the shallow trench isolation regions 15, 16 may be self-aligned by the fins 10. One of the shallow trench isolation regions 15 is centrally arranged between the fins 10.

Wells 18, 20 are formed in the substrate 14 with the well 18 arranged in a vertical direction between the well 20 and a top surface 13 of the substrate 14. The well 18 is composed of semiconductor material having an opposite conductivity type from the semiconductor material of the well 20. The well 18 may serve as a drift region (i.e., an extended drain region) of the completed device structure. The well 18 may be formed by introducing a dopant by, for example, ion implantation into the substrate 14. The well 20 may be formed by introducing a different dopant of opposite conductivity type by, for example, ion implantation in the substrate 14. One or more patterned implantation masks may be formed to define selected areas exposed for the implantations. Each implantation mask may include a layer of a light-sensitive material, such as an organic photoresist, applied by a spin coating process, pre-baked, exposed to light projected through a photomask, baked after exposure, and developed with a chemical developer. Each implantation mask has a thickness and stopping power sufficient to block masked areas against receiving a dose of the implanted ions.

The implantation conditions (e.g., ion species, dose, kinetic energy) may be selected to tune the electrical and physical characteristics (e.g., electrical resistivity and depth profile) of the well 18 and, in particular, to place the depth profile for the well 18 to intersect or nearly intersect the top surface 13 of the substrate 14. Similarly, the implantation conditions may be selected to tune the electrical and physical characteristics of the well 20, and in particular to place the depth profile for the well 20 at a greater depth in the substrate 14 than the depth profile for the well 18. The wells 18, 20 may overlap and/or adjoin along a horizontal interface at which the conductivity type of the semiconductor material changes to provide a junction. In an embodiment, the semiconductor material of well 18 may be doped with an n-type dopant from Group V of the Periodic Table (e.g., phosphorus (P) and/or arsenic (As)) to provide n-type electrical conductivity, and the semiconductor material of well 20 may be doped with a p-type dopant selected from Group III of the Periodic Table (e.g., boron) to provide p-type electrical conductivity. In an alternative embodiment, the semiconductor material of well 18 may be doped with a p-type dopant, and the semiconductor material of well 20 may be doped with an n-type dopant to swap the conductivity types of the wells 18, 20.

Figure 2:
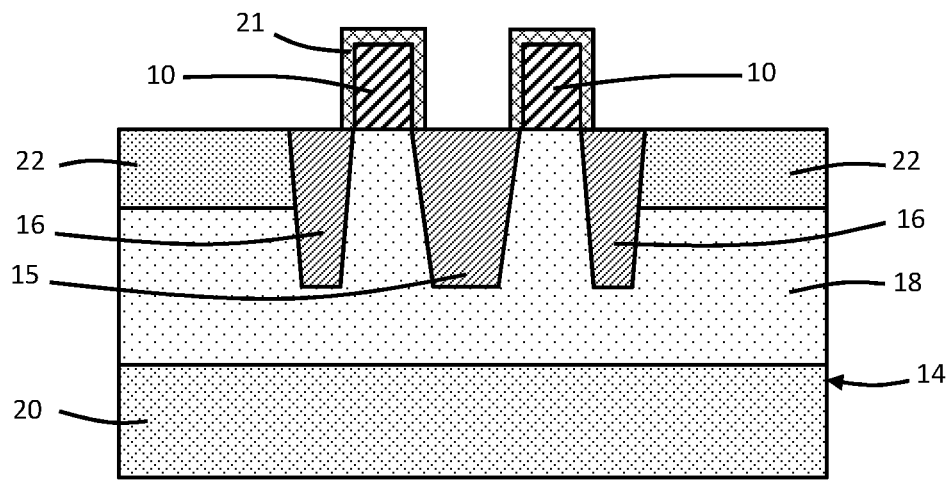

With reference to FIG. 2 in which like reference numerals refer to like features in FIG. 1 and at a subsequent fabrication stage, drain regions 22 are formed in the substrate 14, and are arranged outside of the shallow trench isolation regions 16. The drain regions 22 may be composed of heavily-doped semiconductor material having the same conductivity type as the well 18, which is more lightly doped (i.e., contains a lower dopant concentration). The drain regions 22 may be formed by etching shallow trenches in the substrate 14 and epitaxially growing a doped semiconductor material in the trenches. Alternatively, the drain regions 22 may be formed by ion implantation of the substrate 14. A protective layer 21 may be formed over the fins 10 during the formation of the drain regions 22, and may be removed after the drain regions 22 are formed.

The electrical conductivity of the well 18 is less than the electrical conductivity of the drain regions 22. In an embodiment in which the well 18 is lightly-doped n-type semiconductor material and the well 20 is lightly-doped p-type semiconductor material, the semiconductor material constituting the drain regions 22 may be heavily doped with an n-type dopant. In an embodiment in which the well 18 is lightly-doped p-type semiconductor material and the well 20 is lightly-doped n-type semiconductor material, the semiconductor material constituting the drain regions 22 may be heavily doped with a p-type dopant.

Figure 2A:
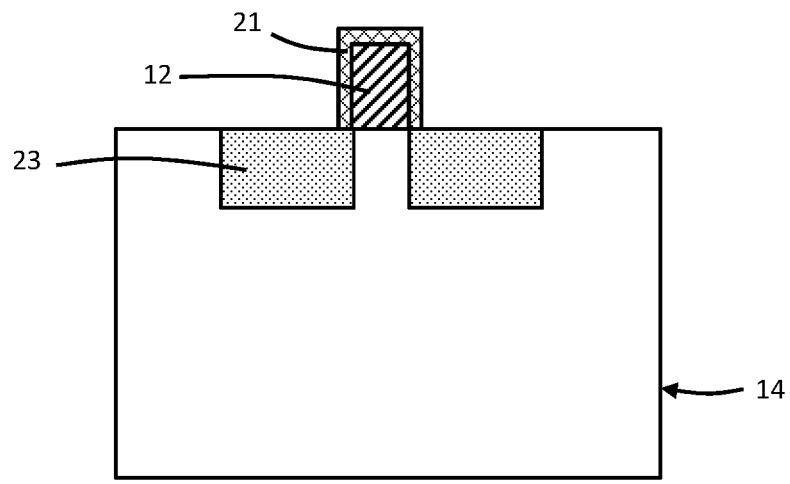
FIG. 2A is a cross-sectional view of a device structure being fabricated in a different device area.

As shown in FIG. 2A, the formation of the drain regions 22 may proceed in parallel with the formation of source/drain regions 23 associated with a vertical-transport field-effect transistor being fabricated in a different device region of the substrate 14 and in relation to another fin 12 that may be formed when fins 10 are formed. As used herein, the term "source/drain region" connotes a doped region of semiconductor material that can function as either a source or a drain of a vertical-transport field-effect transistor. In an embodiment, the drain regions 22 may be concurrently formed with the source/drain regions 23 of the vertical-transport field-effect transistor. The fin 12 may be covered by a section of the protective layer 21 when forming the source/drain regions 23.

Figure 3:
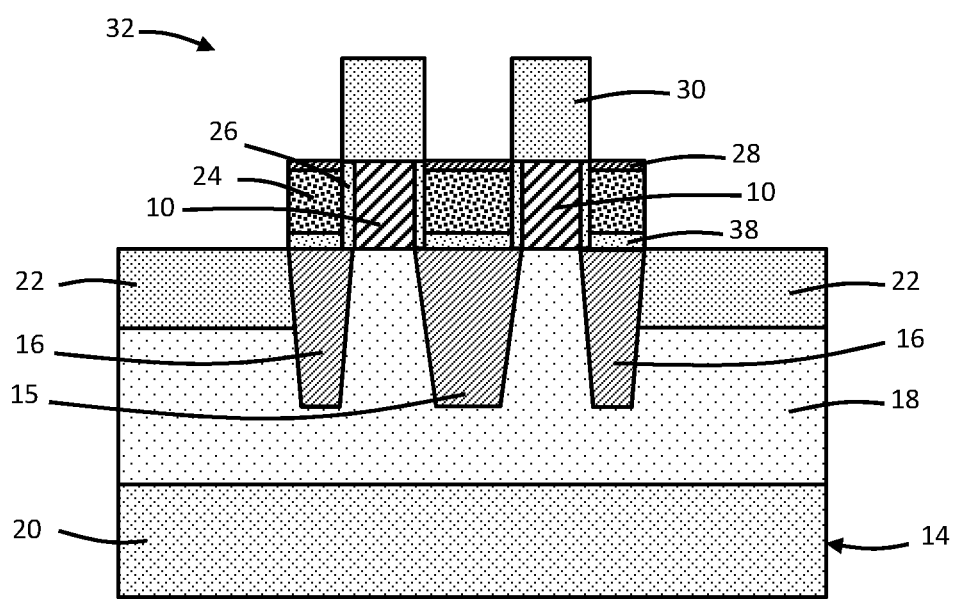

With reference to FIG. 3 in which like reference numerals refer to like features in FIG. 2 and at a subsequent fabrication stage, a gate electrode 24 is formed from a deposited gate stack and is arranged to surround the fins 10. The gate electrode 24 may surround all sides of each of the fins 10 in a gate-all-around (GAA) arrangement. The gate stack used to form the gate electrode 24 may include one or more conformal barrier metal layers and/or work function metal layers, such as layers composed of titanium aluminum carbide (TiAlC) and/or titanium nitride (TiN), and a metal gate fill layer composed of a conductor, such as tungsten (W). The layers of the gate stack may be serially deposited by, for example, atomic layer deposition (ALD), physical vapor deposition (PVD), or chemical vapor deposition (CVD), and patterning the deposited gate stack with lithography and etching processes. The gate electrode 24 may be etched back by chamfering to a given thickness and to expose an upper portion of the fins 10. A gate dielectric layer 26 is arranged between the gate stack and the fins 10. The gate dielectric layer 26 may include a high-k dielectric material, such as a hafnium-based dielectric material like hafnium oxide ($HfO_2$) deposited by atomic layer deposition (ALD). Alternatively, the gate electrode 24 may be composed of doped polysilicon and the gate dielectric layer 26 may be composed of an oxide of silicon.

A spacer layer 38 is arranged below the gate electrode 24, and another spacer layer 28 is arranged over the gate electrode 24. The spacer layers 28, 38 may be composed of a dielectric material, such as silicon nitride ($Si_3N_4$), that is deposited by a directional deposition technique, such as high-density plasma (HDP) deposition, and that may be patterned when the gate stack is patterned.

Source regions 30 are epitaxially grown from the fins 10, and are arranged over the fins 10. The source regions 30 may be composed of semiconductor material that is doped to have the same conductivity type as the drain regions 22. If the drain regions 22 have n-type conductivity, then the source regions 30 may be sections of semiconductor material formed by an epitaxial growth process with in-situ doping, and may contain an n-type dopant. If the drain regions 22 have p-type conductivity, then the source regions 30 may contain a p-type dopant. In an embodiment, the source regions 30 may be formed by a selective epitaxial growth (SEG) process in which the constituent semiconductor material nucleates for epitaxial growth from semiconductor surfaces (e.g., fins 10), but does not nucleate for epitaxial growth from insulator surfaces (e.g., spacer layer 28).

The resulting vertical laterally-diffused metal-oxide-semiconductor device 32 includes the fins 10, the gate electrode 24, the drain regions 22, the source regions 30, and an extended drain region or drift region defined by the well 18. The current flow in the drift region is constrained to travel beneath the shallow trench isolation regions 16 in transit from the source regions 30 to the drain regions 22 during device operation. The current flow in the fins 10 is constrained to travel in a vertical direction in the current path from the source regions 30 to the drain regions 22. The central shallow trench isolation region 15 may influence current flow from the source regions 30 to the drain regions 22. The well 18 operates as a drift resistor that is arranged between the fins 10 and the drain regions 22 and that drops the voltage of the current flowing between the source regions 30 and drain regions 22.

Middle-of-line (MOL) processing and back-end-of-line (BEOL) processing follow, which includes formation of an interconnect structure coupled with the vertical laterally-diffused metal-oxide-semiconductor device 32.

Figure 3A:
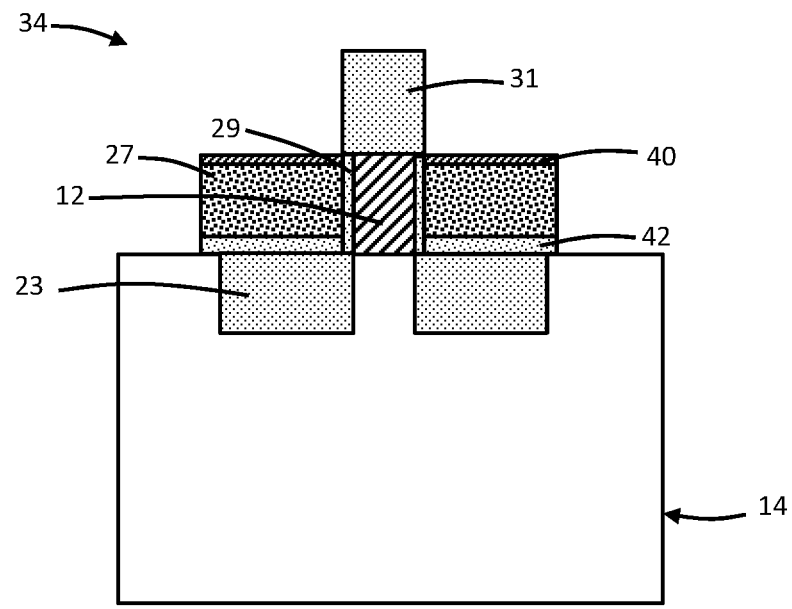
FIG. 3A is a cross-sectional view of the device structure of FIG. 2A at a subsequent fabrication stage.

As shown in FIG. 3A in which like reference numerals refer to like features in FIG. 2A, the formation of the vertical laterally-diffused metal-oxide-semiconductor device 32 may continue to proceed in parallel with the formation of a vertical-transport field-effect transistor 34 being fabricated in the different device region of the substrate 14. The vertical-transport field-effect transistor 34 includes a gate electrode 27 and a gate dielectric layer 29 that may be concurrently formed with the gate electrode 24 and gate dielectric layer 26 of the vertical laterally-diffused metal-oxide-semiconductor device 32. The gate electrode 27 may be positioned on a section of a spacer layer 42 that may be concurrently formed with spacer layer 38, and may be wrapped about the fin 12 in a gate-all-around arrangement.

The vertical-transport field-effect transistor 34 includes a spacer layer 40 arranged over the gate electrode 27 and a top source/drain 31 that is arranged over the fin 12. In an embodiment, the spacer layer 40 may be concurrently formed with the spacer layer 28 of the vertical laterally-diffused metal-oxide-semiconductor device 32. In an embodiment, the top source/drain 31 may be concurrently formed with the source regions 30 of the vertical laterally-diffused metal-oxide-semiconductor device 32. The vertical-transport field-effect transistor 34 lacks the well 18 that is included in the vertical laterally-diffused metal-oxide-semiconductor device 32 and, to that end, the device region used to form the vertical-transport field-effect transistor 34 may be covered by an implantation mask during the implantation forming the well 18.

Figure 4:
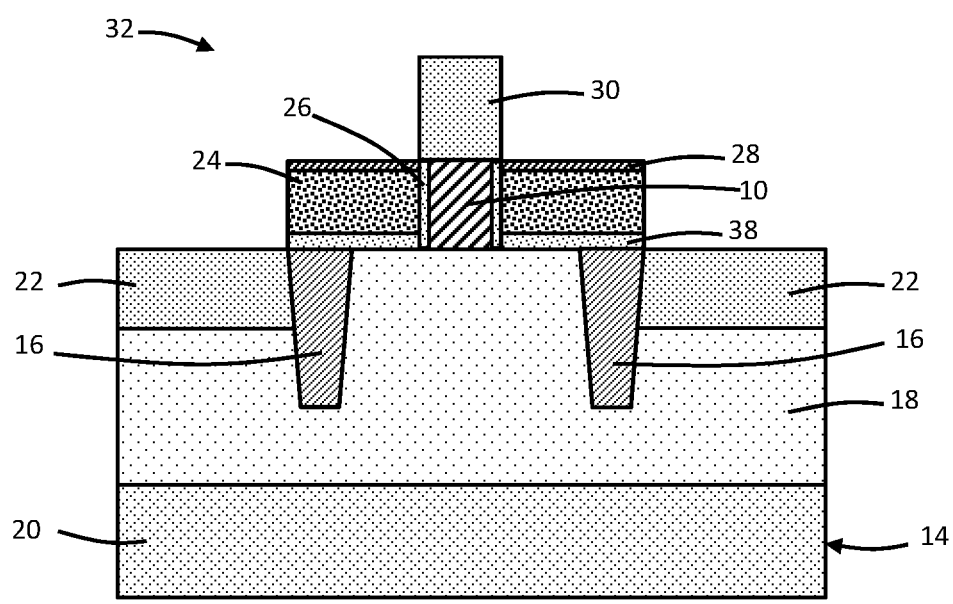
FIG. 4 is a cross-sectional view of a device structure in accordance with alternative embodiments of the invention.

With reference to FIG. 4 in which like reference numerals refer to like features in FIG. 3 and in accordance with embodiments of the invention, the construction of the vertical laterally-diffused metal-oxide-semiconductor device 32 may be modified to eliminate one of the fins 10 and to also eliminate the central shallow trench isolation region 15. The current flow in the drift region is constrained to travel beneath the shallow trench isolation regions 16 in transit from the source region 30 to the drain regions 22 during device operation. The current flow in the fin 10 is constrained to travel in a vertical direction in the current path from the source region 30 to the drain regions 22. The well 18 operates as a drift resistor that is arranged between the fin 10 and the drain regions 22 and that drops the voltage of the current flowing between the source region 30 and drain regions 22.

Figure 5:
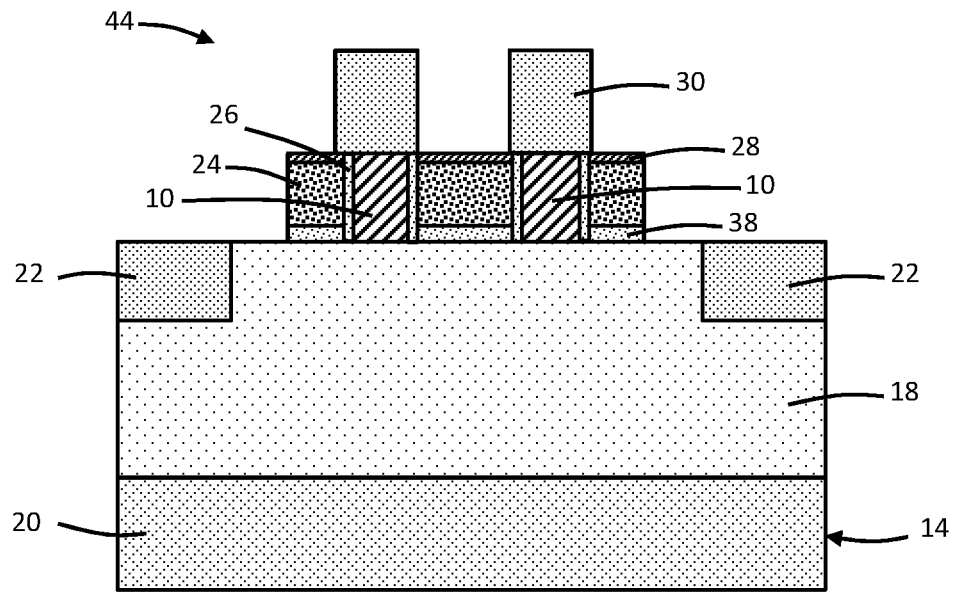
FIG. 5 is a cross-sectional view of a device structure in accordance with alternative embodiments of the invention.

With reference to FIG. 5 in which like reference numerals refer to like features in FIG. 3 and in accordance with embodiments of the invention, the shallow trench isolation regions 15, 16 may be eliminated from the construction to form a vertical drain-extended metal-oxide-semiconductor device 44 that includes the fins 10, the gate electrode 24, the drain regions 22, the source regions 30, and an extended drain region or drift region defined by the well 18. The fins 10, gate electrode 24, and source regions 30 are arranged over the well 18 laterally between the drain regions 22. The current flow in the drift region is no longer constrained to travel beneath the shallow trench isolation regions 16 in transit from the source regions 30 to the drain regions 22 during device operation. The current flow in the fins 10 is still constrained to travel in a vertical direction in the current path from the source regions 30 to the drain regions 22. The well 18 operates as a drift resistor that is arranged between the fins 10 and the drain regions 22 and that drops the voltage of the current flowing between the source regions 30 and drain regions 22.

Figure 6:
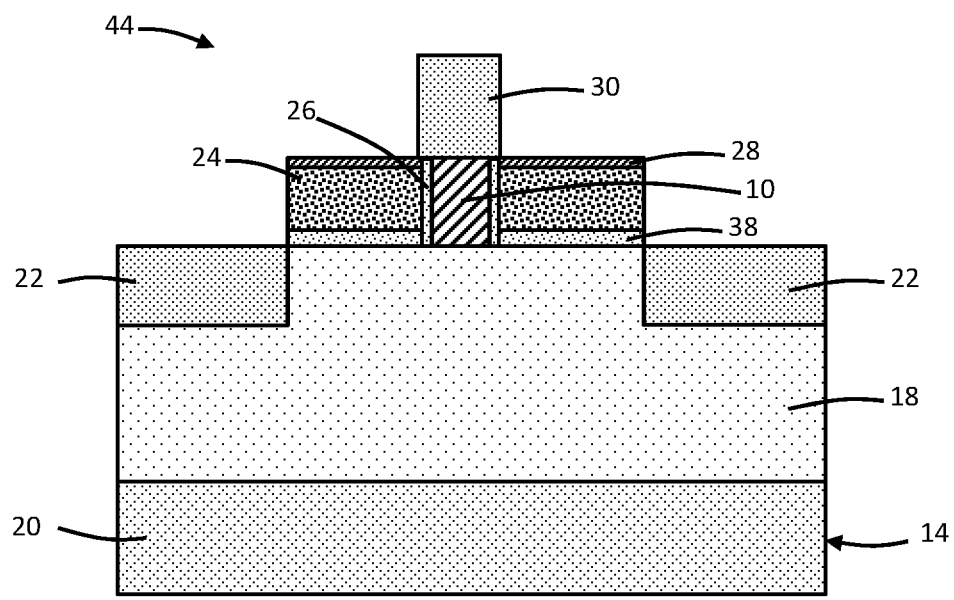
FIG. 6 is a cross-sectional view of a device structure in accordance with alternative embodiments of the invention.

With reference to FIG. 6 in which like reference numerals refer to like features in FIG. 4 and in accordance with embodiments of the invention, the shallow trench isolation regions 15, 16 may be eliminated from the construction to form a vertical drain-extended metal-oxide-semiconductor device 44 that includes the fin 10, the gate electrode 24, the drain regions 22, the source regions 30, and an extended drain region or drift region defined by the well 18. The current flow in the drift region is no longer constrained to travel beneath the shallow trench isolation regions 16 in transit from the source regions 30 to the drain regions 22 during device operation. The current flow in the fin 10 is still constrained to travel in a vertical direction in the current path from the source regions 30 to the drain regions 22. The well 18 operates as a drift resistor that is arranged between the fin 10 and the drain regions 22 and that drops the voltage of the current flowing between the source regions 30 and drain regions 22.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure formed using a substrate, the structure comprising:
    a first semiconductor fin projecting from the substrate;
    a second semiconductor fin projecting from the substrate;
    a gate electrode arranged to extend about the first semiconductor fin and the second semiconductor fin;
    a first drain region in the substrate, the first drain region having a first conductivity type and a first electrical conductivity;
    a first source region coupled with the first semiconductor fin, the first source region arranged over the first semiconductor fin, and the first source region having the first conductivity type;
    a drift region arranged in the substrate beneath the first semiconductor fin, the drift region having the first conductivity type, and the drift region having a second electrical conductivity that is less than the first electrical conductivity of the first drain region; and
    a first trench isolation region in the substrate, the first trench isolation region laterally arranged in the drift region between the second semiconductor fin and the first semiconductor fin, and the first trench isolation region penetrating from a top surface of the substrate partially through the drift region.

2. The structure of claim 1 further comprising:
    a second trench isolation region in the substrate, the second trench isolation region laterally arranged between the first drain region and the first semiconductor fin, and the second trench isolation region penetrating from the top surface of the substrate partially through the drift region.

3. The structure of claim 2 further comprising:
    a second drain region in the substrate, the second drain region having the first conductivity type; and
    a third trench isolation region in the substrate, the third trench isolation region laterally arranged between the second drain region and the first semiconductor fin, and the third trench isolation region penetrating from the top surface of the substrate partially through the drift region.

4. The structure of claim 2 wherein the drift region extends laterally beneath the second trench isolation region to the first drain region.

5. The structure of claim 1 further comprising:
    a second source region coupled with the second semiconductor fin, the second source region arranged over the second semiconductor fin, and the second source region having the first conductivity type.

6. The structure of claim 1 further comprising:
    a well in the substrate,
    wherein the drift region is arranged between the well and the top surface of the substrate, and the well has a second conductivity type opposite from the first conductivity type.

7. The structure of claim 1 further comprising:
    a vertical-transport field-effect transistor having a source/drain region in the substrate.

8. The structure of claim 1 wherein the gate electrode is arranged to surround all sides of the first semiconductor fin and all sides of the second semiconductor fin.

9. A method comprising:
    forming a first semiconductor fin that projects from a substrate;
    forming a second semiconductor fin that projects from the substrate;
    forming a drift region in the substrate;
    forming a first trench isolation region in the substrate;
    forming a first drain region in the substrate;
    forming a first gate electrode arranged to extend about the first semiconductor fin and the second semiconductor fin; and
    forming a source region coupled with the first semiconductor fin and arranged over the first semiconductor fin,
    wherein the first trench isolation region is laterally arranged in the drift region between the second semiconductor fin and the first semiconductor fin, the first trench isolation region penetrates from a top surface of the substrate partially through the drift region, the first drain region, the source region, and the drift region have a first conductivity type, the drift region is arranged in the substrate beneath the first semiconductor fin, and the drift region has a lower electrical conductivity than the first drain region.

10. The method of claim 9 further comprising:
    forming a second trench isolation region in the substrate,
    wherein the second trench isolation region is laterally arranged between the first drain region and the first semiconductor fin, and the second trench isolation region penetrates from the top surface of the substrate partially through the drift region.

11. The method of claim 10 further comprising:
    forming a second drain region in the substrate; and
    forming a third trench isolation region in the substrate,
    wherein the second drain region has the first conductivity type, and the third trench isolation region is laterally arranged between the second drain region and the first semiconductor fin, and the third trench isolation region penetrates from the top surface of the substrate partially through the drift region.

12. The method of claim 9 further comprising: concurrently forming a source/drain region of a vertical-transport field-effect transistor when forming the source region.

13. The method of claim 9 further comprising:
    concurrently forming a source/drain region of a vertical-transport field-effect transistor when forming the first drain region.

14. The method of claim 9 further comprising:
    concurrently forming a second gate electrode of a vertical-transport field-effect transistor when forming the first gate electrode.

* * * * *